Dec. 12, 1961 M. E. NORRIS 3,013,220
TRANSISTORIZED VOLTAGE CONTROLLED OSCILLATOR
Filed Feb. 3, 1959
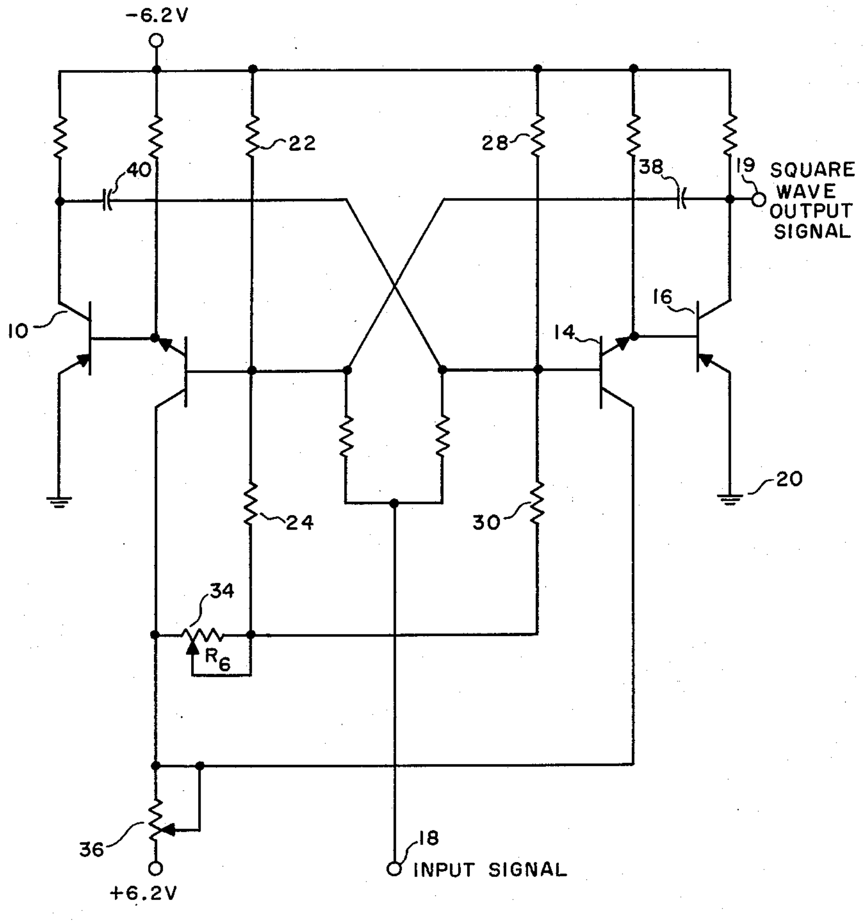
INVENTOR:
MYRON E. NORRIS
BY Edward M. Fassell
ATTORNEY 3,013,220

TRANSISTORIZED VOLTAGE CONTROLLED OSCILLATOR

Myron E. Norris, Haddonfield, N.J., assignor, by mesne assignments, to American Bosch Arma Corporation, Hempstead, N.Y., a corporation of New York Filed Feb. 3, 1959, Ser. No. 790,858
4 Claims. (Cl. 331—113)

This invention relates to oscillators, and more particularly to frequency modulated oscillators which utilize semi-conductor devices.

In many types of telemetric systems, it is necessary to measure a large number of variable functions, such as speed, acceleration or temperature associated with a missile or other aircraft, a plurality of pick-ups are generally employed to convert these variable functions into corresponding electrical signals which are used to frequency modulate subcarrier oscillators which, in turn, may be recorded or used to modulate a carrier signal of a transmitter for transmission to a remote receiving station. The oscillators used are generally of relatively low frequency. With no modulating signal applied thereto, they may be considered as operating at their center frequencies.

Oscillators utilizing semi-conductor devices afford numerous advantages not previously found in conventional vacuum tube oscillators. Notably among these advantages are that the space and power requirements of the components used are greatly minimized. This is particularly important in testing guided missiles and the like where the size and weight of equipment carried by the missile must be minimized due to the vast amount of equipment that the missile must generally carry for guidance, control and other purposes.

One of the main disadvantages of using semi-conductor devices or transistors is that they tend to be unstable when subjected to changes in temperature. In subcarrier oscillators included in a telemetering system wherein changes in frequency represent information relating to the function measured, it is important that substantially no frequency drifts result from changes in ambient temperature. Even a slight change in frequency, since the center frequencies of such subcarrier oscillators are relatively low, results in a high percentage of change and therefore a high degree of inaccuracy at the receiving or recording position.

It is an object of this invention to provide an improved oscillator of high stability utilizing semi-conductor devices.

It is a further object of this invention to provide an improved oscillator utilizing semi-conductor devices in which the center frequency remains relatively constant when no modulating signal is applied thereto for wide changes in temperature range.

It is a further object of this invention to provide a compensation network in which transistors of different types may be readily matched to attain temperature compensation.

In accordance with the present invention, a voltage controlled oscillator utilizing semi-conductor devices is provided. The oscillator includes two pairs of transistors with each pair including two transistors of opposite conductivity types. A cross coupling network is provided between the two pairs of transistors to sustain oscillation. Means are provided to apply a modulating signal to vary the frequency of the oscillator in accordance with information signals. The transistors in each pair of opposite conductivity types are connected so that changes in their junction voltages resulting from temperature changes cancel each other to thereby maintain the input voltage to the oscillator at a relatively constant level. An additional feedback arrangement provides means for adjusting the characteristics of one of the transistors in each of the pair of transistors to match the characteristic of the other to cancel the effects of changing collector currents resulting from temperature changes.

Other objects and advantages of the present invention will be apparent and suggest themselves to those skilled in the art to which the present invention is related, from a reading of the following specification and claims in conjunction with the accompanying drawing, in which the sole figure of the drawing is a schematic diagram illustrating an oscillator circuit, in accordance with the present invention.

Referring to the sole figure of the drawing, an astable free-running oscillator comprises four transistors 10, 12, 14 and 16. The oscillator is designed to be frequency modulated in accordance with the amplitude of an input signal applied between a terminal 18 and a point of reference potential, hereinafter referred to as ground. The input signal, for example, may be a variable amplitude D.C. signal from a transducer. The output modulated signal is applied to an output terminal 19, which may be connected to frequency modulate a carrier signal or to a recorder.

The transistors 10 and 12 may be considered as a pair matched to provide temperature compensation, as may be the transistors 14 and 16. The two pairs of transistors are connected by a cross coupling network to provide multivibrator operation, such multivibrators being well known to those skilled in the art. The biasing arrangement for the pair of transistors 10 and 12 include resistors 22, 24, 34 and 36. The biasing arrangement for the pair of transistors 14 and 16 include resistors 28, 30, 34 and 36. Means for varying the bias are provided by the variable resistors 34 and 36. The values of the various resistors used are chosen so that when the transistor 12 is conducting, the transistor 10 is cutoff. Likewise, in the pair of transistors 14 and 16, when the transistor 14 is conducting, the transistor 16 is held cutoff. A pair of capacitors 38 and 40 provide cross coupling paths between the pair of transistors 10 and 12 and the pair of transistors 14 and 16 to permit oscillations to be sustained.

In considering the operation of the circuit, when the transistor 16 goes from a conducting state to cutoff, a negative pulse is transmitted through the capacitor 38 to the base of the transistor 12. This causes the transistor 12 to become cutoff and the transistor 10 to become conducting. When the transistor 10 changes from a cutoff to a conducting state, a positive pulse is transmitted through the capacitor 40 to hold transistor 14 in a conducting state. This in turn maintains the transistor 16 at cutoff. The action begins again when capacitor 38 charges and the level at the base of the transistor 12 reaches a potential sufficient to permit the transistor 12 to become conductive.

The action described is substantially that of a multivibrator circuit. Such circuits, as is well known, are free-running and have a substantially square wave output signal, the frequency of which is dependent upon the particular values of the coupling capacitors, resistors, and operating potentials involved.

The operating states of the transistors 12 and 14 and consequently the frequency of the oscillator is dependent, among other things, upon the voltages applied to their bases. Thus when a signal of variable D.C. amplitude, representing information signals, are applied to the input terminal 18, the operating states of the transistors 12 and 14 are varied accordingly to thereby change the frequency of oscillation.

The center frequency of the oscillator may be adjusted originally by changing the D.C. bias level at the bases of the transistors 12 and 14. This bias level may be changed by varying the resistor 34.

As previously mentioned, in low frequency subcarrier oscillators used for telemetering purposes, it is very important that frequencies be not substantially affected by variations in temperature, since such changes will result in erroneous data relating to the information signals measured. One of the main disadvantages of transistors is that the base-to-emitter junction voltage tends to vary with changes in temperature. One of the features of the present invention is that this disadvantage is minimized through the use of a pair of transistors of opposite conductivity types connected in the manner shown.

Considering first the pair of transistors 14 and 16, the transistor 14 is of the NPN type and the transistor 16 is of the PNP type. The input circuit, or source of information signals, may be considered as being connected across the two transistors between the terminal 18 and ground. The transistors 14 and 16 may be considered as connected in series relationship with the emitter of the transistor 14 being connected to the base of the transistor 16. The input signal is applied to the base of the transistor 14 and the emitter of the transistor 16 is connected to ground.

When a temperature change causes the base-emitter junction voltage of the transistor 14 to change, such a change will result in the junction voltage of the transistor 16 also changing. Since the transistors 14 and 16 are of opposite conductivity types, the junction voltages developed will be of opposite polarities and therefore cancel each other. Since this is true, the voltage between the terminal 18 and ground across the transistors 14 and 16 will remain relatively unaffected by changes in temperature. A similar condition also exists for the transistors 10 and 12.

It is thus seen that with the circuit shown that the frequency of the oscillator will not tend to drift as a result of changing base-to-emitter junction voltages which result from temperature changes. No oscillator drift will therefore occur and the changes in the frequency of the oscillator will represent the amplitude modulated signal applied to the input terminal 18.

It is noted that although transistors are paired to attain temperature compensation, nevertheless, each of the transistors in each pair perform amplifying functions as well. Thus, this invention does not merely involve the addition of transistors to attain temperature compensation.

Another disadvantage found in transistors is that the collector cutoff current increases with increases in temperature. Such increases in collector cutoff current tends to affect the base bias potentials of the transistors involved. Such changes in base potentials tend to shift the frequency of the oscillator shown.

Another feature of the present invention is the provision of a feedback circuit which tends to minimize the effects of changing collector to base cutoff currents resulting from temperature changes. Considering the transistors 12 and 14, when the collector to base current varies therein, a variable voltage is developed across the resistor 36. The voltage developed across the resistor 36 is applied to the bases of the transistors 12 and 14 to thereby compensate for any tendency of the base voltages to vary as a result of temperature changing the collector to base cutoff current.

The resistor 36 is made variable to provide means for matching the characteristics of the transistor 14 with the characteristics of the transistor 16 and also for matching the characteristics of the transistor 12 with the characteristics of the transistor 10.

It is seen that the present invention has provided a relatively simple circuit for maintaining the frequency of an oscillator relatively constant for changing temperatures. Likewise, a relatively simple circuit is provided for matching a pair of opposite types of transistors to provide a good compensating effect.

What is claimed is:

1. An oscillator comprising two pairs of semi-conductor devices, each of said pairs including a first and second semi-conductor device of opposite conductivity types, each said semi-conductor device including a base, an emitter and a collector electrode, means for connecting the emitter of said first semi-conductor device to the base of said second semi-conductor device of each of said pairs to compensate for differences in base-to-emitter junction voltages resulting from temperature changes, a cross coupling path between the collector of the second transistor of each of said two pairs of semi-conductor devices and the base of the first transistor of each of said two pairs for sustaining oscillations, the center frequency of said oscillations being dependent upon the bias potentials applied between the bases and collectors of said first transistors of each pair of said pairs of semi-conductor devices, and a feedback circuit connected between the collectors and bases of said first transistor of each pair and including a variable resistor connected to said collectors of said first transistor of each pair and to a bias voltage source to compensate for changes in said bias potentials resulting from changes in temperature by changing the base current according to voltage changes across said variable resistor due to collector current variations whereby the voltage developed across said variable resistor is fed back to said bases of said first transistors of each pair.

2. An oscillator comprising two pairs of semi-conductor devices, each of said pairs including a first semi-conductor device of the NPN type and a second semi-conductor of the PNP type, each said semi-conductor device including a base, an emitter and a collector electrode, means for connecting the emitter of said first semi-conductor device to the base of said second semi-conductor device of each of said pairs to compensate for differences in base-to-emitter junction voltages resulting from temperature changes, a cross coupling path between the collector of the second transistor of each of said two pairs of semi-conductor devices and the base of the first transistor of each of said two pairs for sustaining oscillations, the center frequency of said oscillations being dependent upon the bias potentials applied to said pairs of semi-conductor devices, means for applying bias potentials between the bases and collectors of said first transistors of each pair of said pairs of semi-conductor devices, a feedback circuit connected between the collectors and bases of said first transistor of each pair and including a variable resistor connected to said collectors of said first transistor of each pair and to a bias voltage source to compensate for changes in said bias potentials resulting from changes in temperature by changing the base current according to voltage changes across said variable resistor due to collector current variations whereby the voltage developed across said variable resistor is fed back to said bases of said first transistors of each pair, and means for applying a modulating signal to vary the frequency of said oscillator.

3. An oscillator comprising two pairs of semi-conductor devices, each of said pairs including a first semi-conductor device of the NPN type and a second semi-conductor of the PNP type, each said semi-conductor including a base, an emitter and a collector electrode, means for connecting the emitter of said first semi-conductor device to the base of said second semi-conductor device of each of said pairs to compensate for differences in base-to-emitter junction potentials resulting from temperature changes, a cross coupling path including a resistive capacitive network between the collector of the second transistor of each of said two pairs of semi-conductor devices and the base of the first transistor of each of said two pairs for sustaining oscillations at a predetermined center frequency, the center frequency of said oscillations further being dependent upon bias potentials applied to said pairs of semi-conductor devices, means for applying bias potentials between the bases and collectors of said first transistors of each pair of said pairs of semi-conductor devices, a feedback circuit connected between the collectors and bases of the said first transistor of each pair and including a variable resistor connected to said collectors of said first transistor of each pair and to a bias voltage source to compensate for changes in said bias potentials resulting from changes in temperature by changing the base current according to voltage changes across said variable resistor due to collector current variations whereby the voltage developed across said variable resistor is fed back to said bases of said first transistors of each pair, and means for applying a modulating signal to vary the frequency of said oscillator.

4. A multivibrator oscillator comprising two pairs of transistors, each of said pairs including an NPN type transistor and a PNP type transistor, each of said transistors including a base, an emitter and a collector electrode, means for connecting the emitter of said first transistor to the base of said second transistor of each of said pairs to compensate for differences in base-to-emitter junction potentials resulting from temperature changes, a cross coupling path including a resistive capacitive network between the collector of the second transistor of each of said two pairs of transistors and the base of the first transistor of each of said two pairs for sustaining oscillations at a predetermined center frequency, the center frequency of said oscillations further being dependent upon bias potentials applied to said two pairs of transistors, means for applying bias potentials between the bases and collectors of said first transistors of each pair of said two pairs of transistors, a feedback circuit connected between the collectors and bases of said first transistor of each pair and including a variable resistor connected to said collectors of said first transistor of each pair and to a bias voltage source to compensate for changes in said bias potentials resulting from changes in temperature by changing the base current according to voltage changes across said variable resistor due to collector current variations whereby the voltage developed across said variable resistor is fed back to said bases of said first transistors of each pair, and means for applying a variable amplitude direct current signal to frequency modulate said oscillator in accordance therewith.

References Cited in the file of this patent

UNITED STATES PATENTS

| | | |
|---|---|---|
| 2,798,160 | Bruck et al. | July 2, 1957 |
| 2,838,675 | Wanlass | June 10, 1958 |
| 2,894,215 | Toy | July 7, 1959 |

OTHER REFERENCES

"Feedback Stabilizes Flip-Flop," by Cheilik, in Electronics Engineering edition, May 9, 1958, pages 92, 94, 96.